(12) United States Patent
Song et al.

(10) Patent No.: US 10,481,423 B2
(45) Date of Patent: Nov. 19, 2019

(54) COVER WINDOW AND FOLDABLE DISPLAY DEVICE INCLUDING THE SAME

(71) Applicant: LG Display Co., Ltd., Seoul (KR)

(72) Inventors: Kelly Soo Yeun Song, Paju-si (KR); Jae-Hyoung Park, Paju-si (KR); Yu-Lim Won, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/812,258

(22) Filed: Nov. 14, 2017

(65) Prior Publication Data

US 2018/0149904 A1    May 31, 2018

(30) Foreign Application Priority Data

Nov. 30, 2016  (KR) .................. 10-2016-0162310

(51) Int. Cl.
*G02F 1/1333* (2006.01)
*H01L 51/00* (2006.01)
(Continued)

(52) U.S. Cl.
CPC .. *G02F 1/133308* (2013.01); *G02F 1/133305* (2013.01); *G06F 1/1652* (2013.01); *G09F 9/301* (2013.01); *H01L 51/0097* (2013.01); *H01L 51/524* (2013.01); *H01L 51/5246* (2013.01); *G02B 6/0055* (2013.01); *G02F 1/1337* (2013.01); *G02F 1/1368* (2013.01); *G02F 1/133528* (2013.01); *G02F 1/134309* (2013.01); *G02F 1/134363* (2013.01); *G02F 2001/133331* (2013.01); *G02F 2201/121* (2013.01); *G02F 2201/123* (2013.01); *G02F 2201/124* (2013.01); *G02F 2202/36* (2013.01); *H01L 27/3244* (2013.01); *H01L 51/5218* (2013.01); *H01L 51/5221* (2013.01); *H01L 51/5281* (2013.01); *H01L 2251/308* (2013.01); *H01L 2251/5315* (2013.01); *H01L 2251/5338* (2013.01); *H01L 2251/5369* (2013.01)

(58) Field of Classification Search
CPC ..................... G02F 1/133308; G02F 1/133305
USPC ......................................... 428/213
See application file for complete search history.

(56) References Cited

U.S. PATENT DOCUMENTS

| 9,069,521 B2 | 6/2015 | Lee et al. | |
| 2005/0054395 A1* | 3/2005 | Arbisi | H04M 1/022 |
| | | | 455/575.3 |

(Continued)

FOREIGN PATENT DOCUMENTS

| CN | 1836428 A | 9/2006 |
| CN | 103377757 A | 10/2013 |

(Continued)

OTHER PUBLICATIONS

Office Action dated Aug. 9, 2018, issued in the corresponding Taiwanese Patent Application No. 106139557.

(Continued)

*Primary Examiner* — Tahseen Khan
(74) *Attorney, Agent, or Firm* — Morgan, Lewis & Bockius LLP

(57) ABSTRACT

The present invention provides a cover window including a first region having a first stiffness; a second region having a second stiffness being greater than the first stiffness; and a nano-particle in a boundary between the first and second regions.

19 Claims, 9 Drawing Sheets

(51) Int. Cl.
  *H01L 51/52* (2006.01)
  *G06F 1/16* (2006.01)
  *G09F 9/30* (2006.01)
  *F21V 8/00* (2006.01)
  *G02F 1/1335* (2006.01)
  *G02F 1/1337* (2006.01)
  *G02F 1/1343* (2006.01)
  *G02F 1/1368* (2006.01)
  *H01L 27/32* (2006.01)

(56) References Cited

U.S. PATENT DOCUMENTS

| | | | |
|---|---|---|---|
| 2013/0319729 A1 | 12/2013 | Poon | |
| 2014/0065326 A1* | 3/2014 | Lee | G06F 1/16 428/12 |
| 2014/0353613 A1* | 12/2014 | Cheon | H01L 51/0097 257/40 |
| 2015/0043174 A1 | 2/2015 | Han et al. | |
| 2016/0096967 A1* | 4/2016 | Virkar | G02B 1/14 428/215 |
| 2016/0109625 A1* | 4/2016 | Guimard | H01L 51/0097 257/40 |
| 2017/0168224 A1* | 6/2017 | McCamy | B05C 5/02 |

FOREIGN PATENT DOCUMENTS

| | | |
|---|---|---|
| CN | 103852951 A | 6/2014 |
| CN | 104347000 A | 2/2015 |
| TW | 201625996 A | 7/2016 |

OTHER PUBLICATIONS

First Notification of Office Action dated Jul. 24, 2019, issued in the corresponding Chinese Patent Application No. 201711225133.9.

* cited by examiner

<u>1</u>

30

10

20

100

130

110

120

130

330

430

COVER WINDOW AND FOLDABLE DISPLAY DEVICE INCLUDING THE SAME

The present application claims the benefit of Korean Patent Application No. 10-2016-0162310 filed in Korea on Nov. 30, 2016, which is hereby incorporated by reference.

BACKGROUND

Technical Field

The present invention relates to a display device and more particularly to a cover window with improved reliability and a foldable display device including the cover window.

Discussion of the Related Art

As information technology and mobile communication technology have been developed, a display device being capable of displaying a visual image has also been developed. Flat panel display devices, such as a liquid crystal display (LCD) device and an organic light emitting display (OLED) device, are developed and used.

In general, an LCD device includes a liquid crystal panel, which includes upper and lower substrates and a liquid crystal layer therebetween. The liquid crystal layer is driven by an electric field induced between a pixel electrode and a common electrode to display images.

An OLED device includes an organic emitting diode which includes an anode, a cathode and an organic emitting layer therebetween. In the organic emitting diode, holes and electrodes respectively from the anode and the cathode are combined such that light is emitted from the organic emitting layer to display images.

Recently, a foldable display device, which is fabricated by using a flexible substrate, is in demand. The foldable display device may be folded to be portable and may be unfolded to display images. Namely, with the foldable display device, a large-sized image display can be provided, and portability of the display device is improved.

FIG. 1 is a schematic cross-sectional view of a foldable display device according to the related art.

As shown in FIG. 1, the foldable display device 1 includes a display panel 10, a backplate 20 and a cover window 30.

When the display panel 10 is a light emitting diode panel, the display panel 10 may include a flexible substrate, a light emitting diode on the flexible substrate and a thin film transistor (TFT) for driving the light emitting diode.

For example, the organic emitting diode may include an anode, which is connected to the TFT, an organic emitting layer on the anode, and a cathode on the organic emitting layer. In addition, an encapsulation film for preventing moisture penetration may cover the light emitting diode.

On the other hand, when the display panel 10 is a liquid crystal panel, the display panel 10 may include a TFT on the flexible substrate, a pixel electrode, which is connected to the TFT, a counter substrate, which faces the flexible substrate, a common electrode, which is on the flexible substrate or the counter substrate, and a liquid crystal layer between the flexible substrate and the counter substrate. The display panel 10 may further include a backlight unit.

With a carrier substrate (not shown) attached to a lower surface of the flexible substrate, elements such as the TFT are formed on the flexible substrate, and the carrier substrate is released to obtain the flexible display panel 10.

In the flexible display panel 10, since the flexible substrate is thin, the backplate 20 for supporting the display panel 10 is disposed under the display panel 10.

The cover window 30 is attached to an upper side of the display panel 10. The damage on the display panel 10 from outer impacts is prevented by the cover window 30. Although not shown, the cover window 30 may be attached to the display panel 10 by an adhesive layer. For example, the cover window 30 may be formed of a tempered glass or high-hardness plastic.

In the related art foldable display device, when the folding and unfolding operation is repeated in the foldable display device 1, damages, e.g., cracks, may be generated in the cover window 30 such that the display quality and reliability (durability) of the cover window 30 and the foldable display device 1 are decreased.

SUMMARY

Accordingly, embodiments of the present disclosure are directed to a cover window and a foldable display device that substantially obviate one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a cover window comprises a first region having a first stiffness; a second region having a second stiffness being greater than the first stiffness; and a nano-particle in a boundary between the first and second regions.

In another aspect, a cover window comprises a first region having a first stiffness and including a pattern region and a non-pattern region at a periphery of the pattern region; a second region having a second stiffness being greater than the first stiffness; and a nano-particle in the first region, wherein the nano-particle has a first density in the pattern region and a second density in the non-pattern region, and the first density is different from the second density.

In another aspect, a foldable display device comprises a display panel; and a cover window on a display side of the display panel, the cover window including: a first region having a first stiffness; a second region having a second stiffness being greater than the first stiffness; and a nano-particle in a boundary between the first and second regions.

In another aspect, a foldable display device comprises a display panel; and a cover window on a display side of the display panel, the cover window including: a first region having a first stiffness and including a pattern region and a non-pattern region at a periphery of the pattern region; a second region having a second stiffness being greater than the first stiffness; and a nano-particle in the first region, wherein the nano-particle has a first density in the pattern region and a second density in the non-pattern region, and the first density is different from the second density.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Reference will now be made in detail to the preferred embodiments, examples of which are illustrated in the accompanying drawings.

Figure 1:
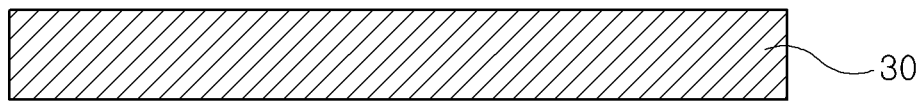
FIG. 1 is a schematic cross-section view of the related art foldable display device.
Figure 1:
Figure 1:
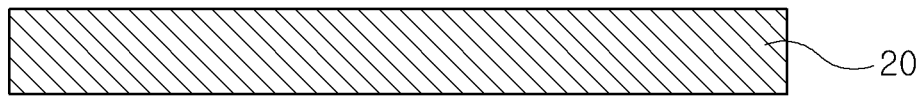
Figure 2:
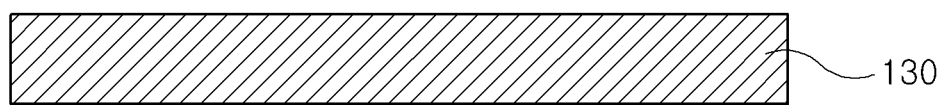
FIG. 2 is a schematic cross-sectional view of a foldable display device according to an embodiment of the present invention.
Figure 2:
Figure 2:
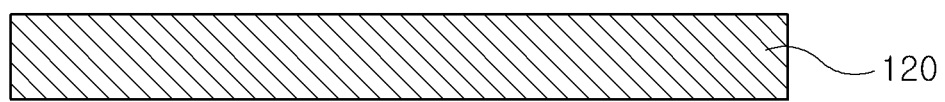

FIG. 2 is a schematic cross-sectional view of a foldable display device according to an embodiment of the present invention.

As shown in FIG. 2, a foldable display device 100 according to the present invention includes a display panel 110, a backplate 120 and a cover window 130.

The foldable display device of the present invention can be folded, bent or rolled along at least one direction. The foldable display device of the present invention can be referred to as a bendable display device, a rollable display device or a flexible display device.

In the foldable display device 100, the backplate 120 is disposed under and covers a rear side of the display panel 110. The display panel 110 is protected and supported by the backplate 120. The cover window 130 is disposed on and covers a front side, i.e., a display side, of the display panel 110. The front side of the display panel 110 is protected by the cover window 130.

Although not shown, a touch panel may be positioned between the display panel 110 and the cover window 130.

The display panel 110 may be a liquid crystal panel or a light emitting diode panel.

Figure 3A:
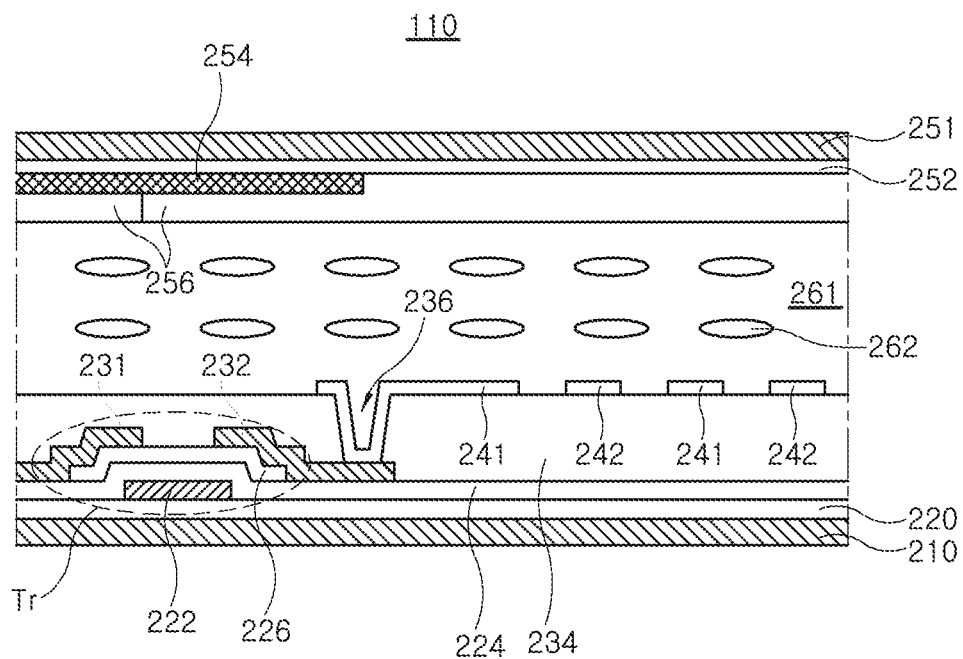
FIGS. 3A and 3B are schematic cross-sectional views of display panels for a foldable display device according to embodiments of the present invention.

Referring to FIG. 3A, which is a schematic cross-section view of a liquid crystal panel, the display panel 110 includes first and second substrates 210 and 251, which face each other, and a liquid crystal layer 261, which includes liquid crystal molecules 262, therebetween.

Each of the first and second substrates 210 and 251 may be a flexible plastic substrate. For example, each of the first and second substrates 210 and 251 may be a polyimide substrate.

A first buffer layer 220 is formed on the first substrate 210, and a TFT Tr is formed on the first buffer layer 220. The first buffer layer 220 may be omitted.

A gate electrode 222 is formed on the first buffer layer 220, and a gate insulating layer 224 is formed on the gate electrode 222. In addition, a gate line (not shown), which is connected to the gate electrode 222, is formed on the first buffer layer 220. The gate insulating layer 224 may be formed of an inorganic insulating material such as silicon oxide or silicon nitride.

A semiconductor layer 226, which corresponds to the gate electrode 222, is formed on the gate insulating layer 224. The semiconductor layer 226 may include an oxide semiconductor material. Alternatively, the semiconductor layer may include an active layer of intrinsic amorphous silicon and an ohmic contact layer of impurity-doped amorphous silicon.

A source electrode 231 and a drain electrode 232, which are spaced apart from each other, are formed on the semiconductor layer 226. In addition, a data line (not shown), which is electrically connected to the source electrode 231 and crosses the gate line to define a pixel region, is formed.

The gate electrode 222, the semiconductor layer 226, the source electrode 231 and the drain electrode 232 constitute the TFT Tr.

A passivation layer 234, which includes a drain contact hole 236 exposing the drain electrode 232, is formed on the TFT Tr.

A pixel electrode 241, which is connected to the drain electrode 232 through the drain contact hole 236, and a common electrode 242, which is alternately arranged with the pixel electrode 241, are formed on the passivation layer 234.

A second buffer layer 252 is formed on the second substrate 251, and a black matrix 254, which shields a non-display region such as the TFT Tr, the gate line and the data line, is formed on the second buffer layer 252. In addition, a color filter layer 256, which corresponds to the pixel region, is formed on the second buffer layer 252. The second buffer layer 252 and the black matrix 254 may be omitted.

The first and second substrates 210 and 251 are attached with the liquid crystal layer 261 therebetween. The liquid crystal molecules 262 of the liquid crystal layer 261 is driven by an electric field between the pixel and common electrode 241 and 242.

Although not shown, first and second alignment layers may be formed over the first and second substrates 210 and 251 to be adjacent to the liquid crystal layer 261. In addition, first and second polarization plates, which have perpendicular transmission axes, may be attached to an outer side of each of the first and second substrates 210 and 251. Moreover, a flexible backlight unit may be disposed under the first substrate 210 to provide light.

For example, the backlight unit may include a light guide plate under the display panel 110, a light source at a side of the light guide plate, a reflective sheet under the light guide plate and an optical sheet between the light guide plate and the display panel 110.

Figure 3B:
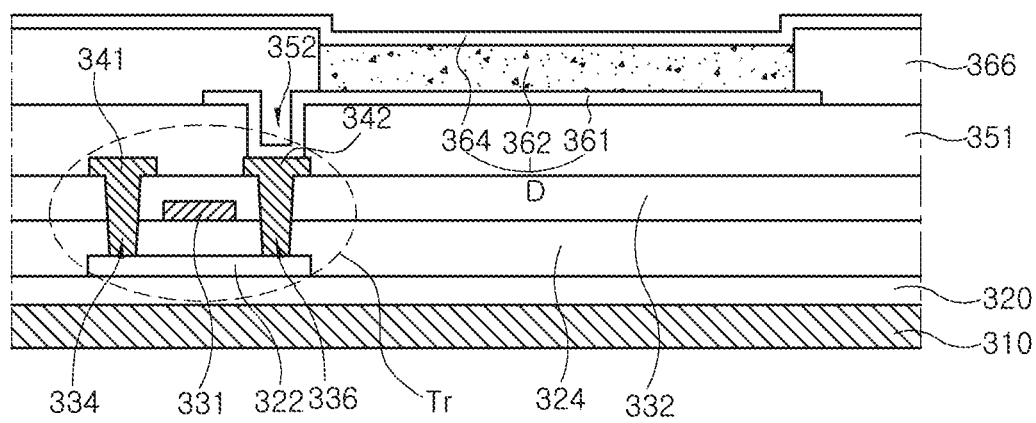

On the other hand, referring to FIG. 3B, which is a schematic cross-section view of a light emitting diode panel, the display panel 110 includes a substrate 310, a TFT Tr on or over the substrate 310 and a light emitting diode D disposed over the substrate 310 and connected to the TFT Tr.

The substrate 310 may be a flexible plastic substrate. For example, the substrates 310 may be a polyimide substrate.

A buffer layer 320 is formed on the substrate 310, and a thin film transistor (TFT) Tr is formed on the buffer layer 320. The buffer layer 320 may be omitted.

A semiconductor layer 322 is formed on the buffer layer 320. The semiconductor layer 322 may include an oxide semiconductor material or polycrystalline silicon.

When the semiconductor layer 322 includes the oxide semiconductor material, a light-shielding pattern (not shown) may be formed under the semiconductor layer 322. The light to the semiconductor layer 322 is shielded or blocked by the light-shielding pattern such that thermal degradation of the semiconductor layer 322 can be reduced or prevented. On the other hand, when the semiconductor layer 322 includes polycrystalline silicon, impurities may be doped into both sides of the semiconductor layer 322.

A gate insulating layer 324 is formed on the semiconductor layer 322. The gate insulating layer 324 may be formed of an inorganic insulating material such as silicon oxide or silicon nitride.

A gate electrode 331, which is formed of a conductive material, e.g., metal, is formed on the gate insulating layer 324 to correspond to a center of the semiconductor layer 322.

In FIG. 3B, the gate insulating layer 324 is formed on the entire surface of the substrate 310. Alternatively, the gate insulating layer 324 may be patterned to have the same shape as the gate electrode 331.

An interlayer insulating layer 332, which is formed of an insulating material, is formed on an entire surface of the substrate 310 including the gate electrode 331. The interlayer insulating layer 332 may be formed of an inorganic insulating material, e.g., silicon oxide or silicon nitride, or an organic insulating material, e.g., benzocyclobutene or photo-acryl.

The interlayer insulating layer 332 includes first and second contact holes 334 and 336 exposing both sides of the semiconductor layer 322. The first and second contact holes 334 and 336 are positioned at both sides of the gate electrode 331 to be spaced apart from the gate electrode 331.

In FIG. 3B, the first and second contact holes 334 and 336 extend into the gate insulating layer 324. Alternatively, when the gate insulating layer 324 is patterned to have the same shape as the gate electrode 331, there may be no first and second contact holes 334 and 336 in the gate insulating layer 324.

A source electrode 341 and a drain electrode 342, which are formed of a conductive material, e.g., metal, are formed on the interlayer insulating layer 332. The source electrode 341 and the drain electrode 342 are spaced apart from each other with respect to the gate electrode 331 and respectively contact both sides of the semiconductor layer 322 through the first and second contact holes 334 and 336.

The semiconductor layer 322, the gate electrode 331, the source electrode 341 and the drain electrode 342 constitute the TFT Tr, and the TFT Tr serves as a driving element.

In FIG. 3B, the gate electrode 331, the source electrode 341 and the drain electrode 342 are positioned over the semiconductor layer 322. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the substrate 310 and cross each other to define a pixel region. In addition, a switching element, which is electrically connected to the gate line and the data line, may be disposed on the substrate 310. The switching element is electrically connected to the TFT Tr as the driving element.

In addition, a power line, which is parallel to and spaced apart from the gate line or the data line, may be formed on or over the substrate 310. Moreover, a storage capacitor for maintaining a voltage of the gate electrode 331 of the TFT Tr during one frame, may be further formed on the substrate 310.

A passivation layer 351, which includes a drain contact hole 352 exposing the drain electrode 342 of the TFT Tr, is formed to cover the TFT Tr.

A first electrode 361, which is connected to the drain electrode 342 of the TFT Tr through the drain contact hole 352, is separately formed in each pixel region. The first electrode 361 may be an anode and may be formed of a conductive material having a relatively high work function. For example, the first electrode 361 may be formed of a transparent conductive material such as indium-tin-oxide (ITO) or indium-zinc-oxide (IZO).

When the display panel 310 is operated in a top-emission type, a reflection electrode or a reflection layer may be formed under the first electrode 361. For example, the reflection electrode or the reflection layer may be formed of aluminum-paladium-copper (APC) alloy.

A bank layer 366, which covers edges of the first electrode 361, is formed on the passivation layer 351. A center of the first electrode 361 in the pixel region is exposed through an opening of the bank layer 366.

An emitting layer 362 is formed on the first electrode 361. The emitting layer 362 may have a single-layered structure of an emitting material layer formed of an emitting material. Alternatively, to improve emitting efficiency, the emitting layer 362 may have a multi-layered structure including a hole injection layer, a hole transporting layer, the emitting material layer, an electron transporting layer and an electron injection layer sequentially stacked on the first electrode 361.

The emitting material layer may include an inorganic emitting material, e.g., a quantum dot, or an organic emitting material.

A second electrode 364 is formed over the substrate 310 including the emitting layer 362. The second electrode 364 is positioned at an entire surface of the display area. The second electrode 364 may be a cathode and may be formed of a conductive material having a relatively low work function. For example, the second electrode 364 may be formed of aluminum (Al), magnesium (Mg) or Al—Mg alloy.

The first electrode 361, the organic emitting layer 362 and the second electrode 364 constitute the light emitting diode D.

Although not shown, an encapsulation film is formed on the light emitting diode D to prevent penetration of moisture into the light emitting diode D. The encapsulation film may have has a triple-layered structure of a first inorganic layer, an organic layer and a second inorganic layer. However, it is not limited thereto.

A polarization plate (not shown) may be disposed on the encapsulation film to reduce an ambient light reflection. The polarization plate may be a circular polarization film.

Referring again to FIG. 2, the backplate 120 may have a plate shape and cover the rear side of the display panel 110. Alternatively, the backplate 120 may include a horizontal surface and side surfaces to cover the rear side and lateral sides of the display panel 110. For example, the backplate 120 may be formed of polymer such as polyethylene terephthalate (PET).

Although not shown, an adhesive layer may be formed between the backplate 120 and the display panel 110.

The cover window 130 may have a plate shape and cover the front side of the display panel 110. An adhesive layer (not shown) may be formed between the cover window 130 and the display panel 110.

Figure 4:
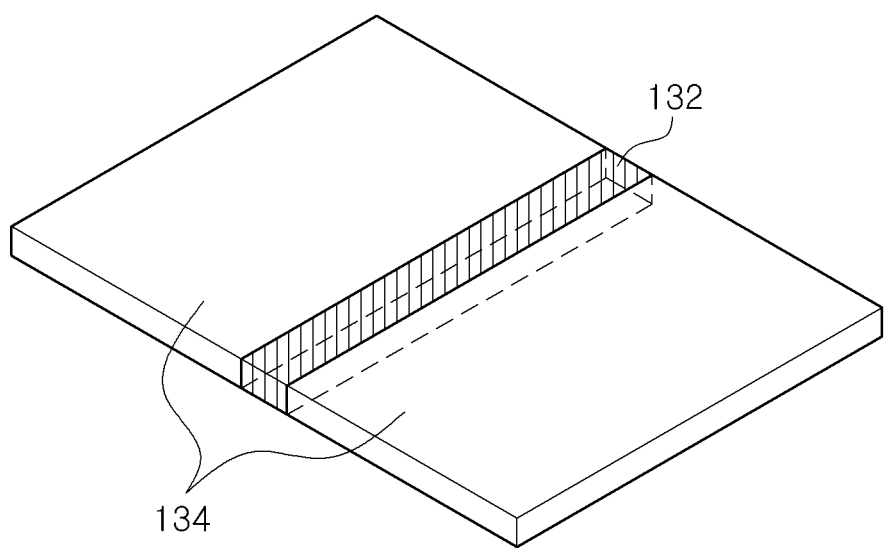
FIG. 4 is a schematic view of a cover window according to an embodiment of the present invention.

Referring to FIG. 4, which is a schematic view of a cover window according to an embodiment of the present invention, the cover window 130 includes a first region 132 of a low stiffness (hardness) material and a second region 134 of a high stiffness material at both sides of the first region 132.

The foldable display device 100 is folded with respective to the first region 132. Namely, in the cover window 130, the first region 132 of the low stiffness material corresponds to a folding region of the foldable display device 100.

Since the display side of the display panel 110 should be protected by the cover window 130, the cover window 130 is generally formed of the high stiffness material. However, when an entirety of the cover window of the foldable display device is formed of the high stiffness material, the cover window may be damaged by stress during folding and unfolding operation.

In the cover window 130 of the present invention, the first region 132, which corresponds to the folding region, is formed of the low stiffness material, and the second region 134, which corresponds to a unfolding region, is formed of the high stiffness material. Accordingly, the damage resulting from the stress during the folding and unfolding operation is decreased by the first region 132 of the low stiffness material, and the display panel 110 is sufficiently protected by the second region 134 of the high stiffness material.

However, in the cover window 130, because the first and second regions 132 and 134 have a difference in a property, the boundary (or interface) between the first and second regions 132 and 134 may be viewed such that a display quality is decreased.

For example, when the first and second regions 132 and 134 are formed of different materials, the boundary between the first and second regions 132 and 134 may be viewed because of the refractive index difference. On the other hand, when the first and second regions 132 and 134 are formed of the same material, the boundary between the first and second regions 132 and 134 may be viewed because of the curing degree difference.

Figure 5:
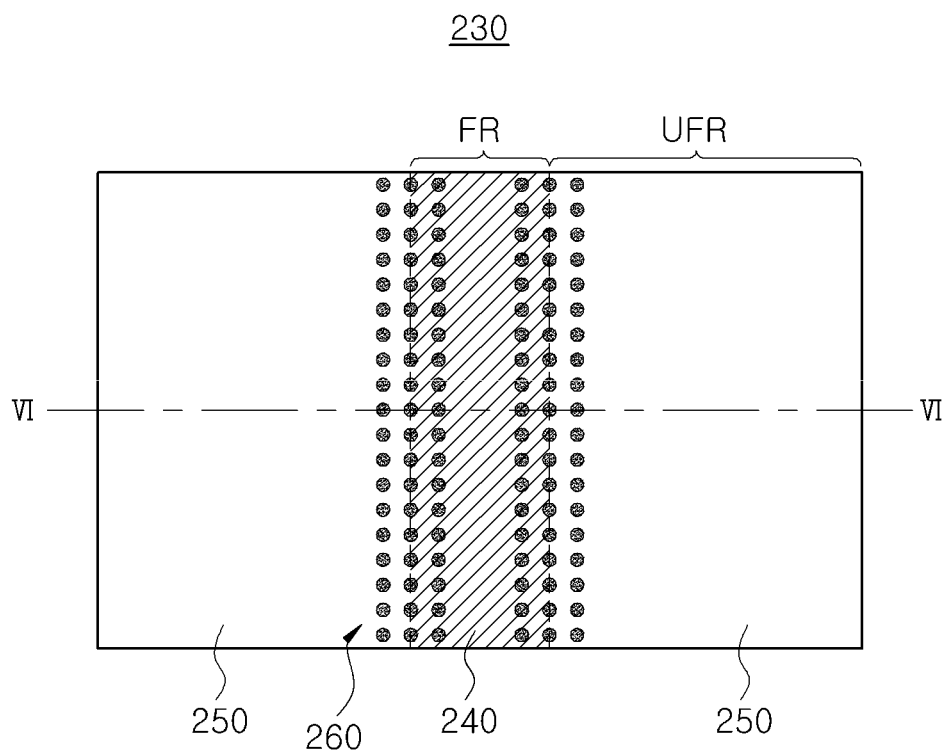
FIG. 5 is a schematic view of a cover window according to an embodiment of the present invention.
Figure 6:
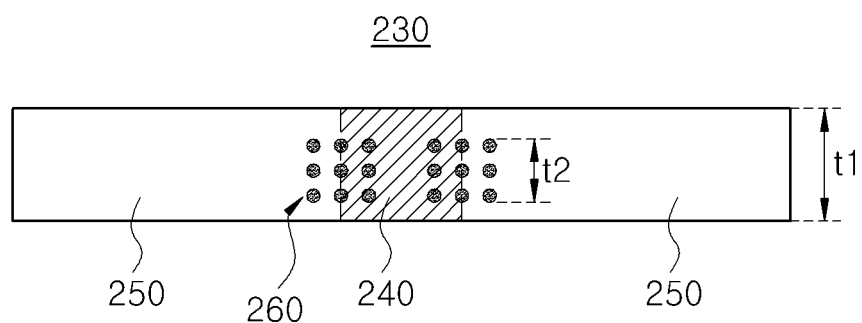
FIG. 6 is a cross-sectional view taken along the line VI-VI in FIG. 5.

FIG. 5 is a schematic view of a cover window according to an embodiment of the present invention, and FIG. 6 is a cross-sectional view taken along the line VI-VI in FIG. 5.

As shown in FIGS. 5 and 6, the cover window 230 includes a first region 240 of a low stiffness material, a second region 250 of a high stiffness material at both sides of the first region 240 and a nano-particle 260 in a boundary between the first and second regions 240 and 250. The foldable display device 100 (of FIG. 2) including the cover window 230 is folded with respective to the first region 240. Namely, in the cover window 230, the first region 240 is defined as a folding region FR, and the second region 250 is defined as a un-folding region UFR.

In FIG. 5, one first region 240 is positioned between two second regions 250. Alternatively, there are one first region 240 and one second region 250. In addition, there are at least two first regions 240 and at least three second regions 250, which are alternately arranged, such that the foldable display device 100 may be folded in at least two positions.

The first and second regions 240 and 250 and the nano-particle 260 has a difference in the refractive index. For example, a refractive index difference between each of the first refractive index (R1) of the first region 240 and the second refractive index (R2) of the second region 250 and the third refractive index (R3) of the nano-particle 260 may be equal to or less than about 0.1 (0<|R1−R3|≤0.1, 0<|R2−R3|0.1), and it is preferred to be equal to or less than 0.03. (0<|R1−R3|≤0.03, 0<|R2−R3|0.03)

The nano-particle 260 is arranged in the boundary of the first and second regions 240 and 250 and positioned in a center of the cover window 230 in a cross section. Namely, each of the first and second regions 240 and 250 has a first thickness t1, and the nano-particle 260 is positioned in a central region having a second thickness t2 being smaller than the first thickness t1.

As a result, the nano-particle 260 is covered with the materials of the first and second regions 240 and 250.

In the cover window 230, weak haze is generated because of the refractive index difference between each of the first and second regions 240 and 250 and the nano-particle 260. It may be referred to as an inner haze.

The visibility of the boundary between the first and second regions 240 and 250 resulting from the property difference between the first and second regions 240 and 250 is shielded or covered by the inner haze resulting from the nano-particle 260. Accordingly, the display quality decrease problem in the foldable display device, where the first and second regions 240 and 250 have a stiffness difference and a different property, e.g., refractive index, is prevented.

A first material of the first region 240 has a stiffness (modulus value or hardness) being smaller than a second material of the second region 250. The first and second regions 240 and 250 may be formed of the same material or different materials.

For example, the first region 240 may be formed of one of polydimethylsiloxane (PDMS), polybutyleacrylate, polyurethane and polystyrene, and the second region 250 may be formed of one of polymethylmetacrylate (PMMA), polycarbonate (PC) and cyclic olefin polymer. Alternatively, the first and second regions 240 and 250 may be formed PDMS and have different modulus values.

The nano-particle 260 may have a size (or diameter) of about 50 to 500 nm and a weight % of about 1 to 10 in the central region where the nano-particle 260 is arranged. To efficiently prevent the visibility of the boundary between the first and second regions 240 and 250 by the inner haze, it may be preferred that the nano-particle 260 has a size of about 300 to 500 nm and a weight % of about 2 to 5.

The nano-particle 260 may be an organic particle or an inorganic particle. For example, the nano-particle 260 may be a silica inorganic nano-particle, a acryl-based resin organic nano-particle, acryl-styrene-based organic nano-particle or polycarbonate-based organic nano-particle.

In variation of a weight % of the nano-particle in a PDMS base, the haze and the transmittance of the cover window are measured and listed in Table 1. The nano-particle having a size of 300 nm is used.

TABLE 1

|  | Wt % | | | |
| --- | --- | --- | --- | --- |
|  | 1 | 2 | 5 | 10 |
| Haze (%) | <1 | 2-7 | 8-10 | >10 |
| Transmittance (%) | >92 | 91-92 | 89-90 | <87 |

As shown in Table 1, to prevent the visibility of the boundary between the first and second regions 240 and 250, a weight % of the nano-particle 260 may be equal to or greater than 1. On the other hand, when the weight % of the nano-particle 260 is greater than 10, the haze is increased such that it is difficult to apply the cover window 230 to a display side of the display device.

In variation of a size of the nano-particle in a PDMS base, the haze and the transmittance of the cover window are measured and listed in Table 2. In this instance, the nano-particle has a weight % of 5 with respect to the PDMS base.

TABLE 2

| | Size (nm) | | | |
|---|---|---|---|---|
| | 50 | 300 | 500 | 1000 |
| Haze (%) | <1 | 8-10 | 8-12 | >30 |
| Transmittance (%) | 90-92 | 89-90 | 85-87 | <70 |

As shown in Table 2, to prevent the visibility of the boundary between the first and second regions 240 and 250, a size of the nano-particle 260 may be equal to or greater than 50 nm. On the other hand, when the size of the nano-particle 260 is greater than 1000, the haze is increased such that it is difficult to apply the cover window 230 to a display side of the display device.

As mentioned above, in the cover window 230, the nano-particle 260 is included in the boundary between the first region 240 of low stiffness and the second region 250 of high stiffness such that the inner haze is generated by the refractive index difference between the nano-particle 260 and each of the first and second regions 240 and 250. As a result, the visibility problem of the boundary between the first and second regions 240 and 250 is prevented.

When the nano-particle 260 is arranged at a surface of the cover window 230, the scattered reflection is generated such that the display quality of the display device is decreased. Accordingly, it may be preferred that the nano-particle 260 is included inside the cover window 230.

For example, after the polymers for the first and second regions 240 and 250 are injected to be a thickness being smaller than the first thickness t1 (of FIG. 6), the nano-particle 260 is sprayed on the polymers. Then, the polymers are injected again to cover the nano-particle 260 and cured to form the cover window 230.

In FIGS. 5 and 6, the nano-particle 260 are arranged in the boundary of the first and second regions 240 and 250.

Figure 7:
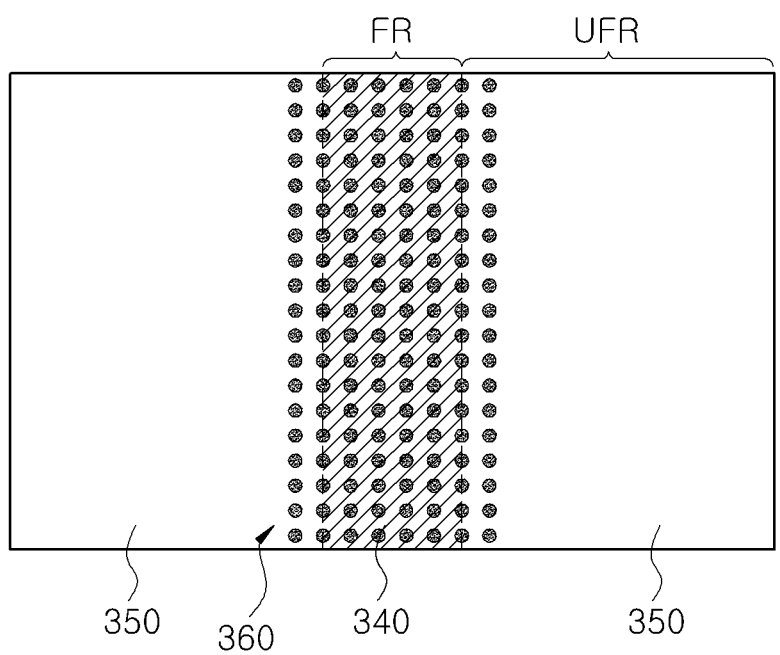
FIG. 7 is a schematic view of a cover window according to an embodiment of the present invention.

Alternatively, as shown in FIG. 7, which is a schematic view of a cover window according to an embodiment of the present invention, the nano-particle 360 may be arranged or positioned in an entire of the first region 340 as well as the boundary between the first and second regions 340 and 350. Namely, in the cover window 330, the nano-particle 360 may be positioned in a part of the unfolding region UFR and an entire of the folding region FR.

Figure 8:
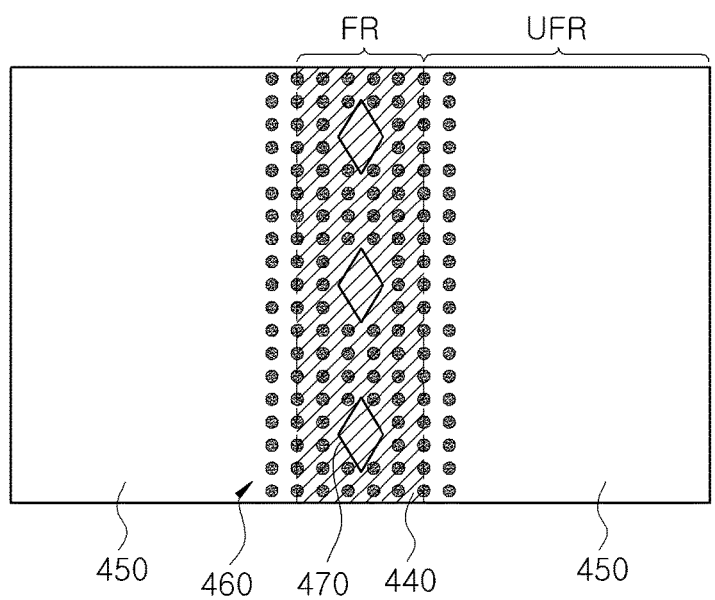
FIG. 8 is a schematic view of a cover window according to an embodiment of the present invention.

FIG. 8 is a schematic view of a cover window according to an embodiment of the present invention.

As shown in FIG. 8, the cover window 430 includes a first region 440 of low stiffness, a second region 450 of low stiffness at both sides of the first region 440 and a nano-particle 460 in an entire of the first region 440 except a pre-determined pattern region (pattern region) 470 and a boundary between the first and second regions 440 and 450.

The foldable display device 100 (of FIG. 2) is folded with respective to the first region 440. Namely, in the cover window 430, the first region 440 is defined as a folding region FR, and the second region 450 is defined as a un-folding region UFR.

In FIG. 8, one first region 440 is positioned between two second regions 450. Alternatively, there are one first region 440 and one second region 450. In addition, there are at least two first regions 440 and at least three second regions 450, which are alternately arranged, such that the foldable display device 100 may be folded in at least two positions.

The first and second regions 440 and 450 and the nano-particle 460 has a difference in the refractive index. For example, a refractive index difference between each of the first refractive index (R1) of the first region 240 and the second refractive index (R2) of the second region 250 and the third refractive index (R3) of the nano-particle 260 may be equal to or less than about 0.1 (0<|R1−R3|≤0.1, 0<|R2−R3|0.1), and it is preferred to be equal to or less than 0.03. (0<|R1−R3|≤0.03, 0<|R2−R3|0.03)

The nano-particle 460 is arranged in the boundary of the first and second regions 440 and 450 and the entire of the first region 440 except the pre-determined pattern region 470 and is positioned in a center of the cover window 430 in a cross section. Namely, each of the first and second regions 440 and 450 has a first thickness t1 (of FIG. 6), and the nano-particle 460 is positioned in a central region having a second thickness t2 (of FIG. 6) being smaller than the first thickness t1.

As a result, the nano-particle 460 is covered with the materials of the first and second regions 440 and 450.

In the cover window 430, weak haze is generated because of the refractive index difference between each of the first and second regions 440 and 450 and the nano-particle 460. It may be referred to as an inner haze.

The visibility of the boundary between the first and second regions 440 and 450 resulting from the property difference between the first and second regions 440 and 450 is shielded or covered by the inner haze resulting from the nano-particle 460. Accordingly, the display quality decrease problem in the foldable display device, where the first and second regions 440 and 450 have a stiffness difference and a different property, e.g., refractive index, is prevented.

A first material of the first region 440 has a stiffness (modulus value or hardness) being smaller than a second material of the second region 450.

For example, the first region 440 may be formed of one of polydimethylsiloxane (PDMS), polybutyleacrylate, polyurethane and polystyrene, and the second region 450 may be formed of one of polymethylmetacrylate (PMMA), polycarbonate (PC) and cyclic olefin polymer. Alternatively, the first and second regions 440 and 450 may be formed PDMS and have different modulus values.

The nano-particle 460 may have a size (or diameter) of about 50 to 500 nm and a weight % of about 1 to 10 in the central region where the nano-particle 460 is arranged. To efficiently prevent the visibility of the boundary between the first and second regions 440 and 450 by the inner haze, it may be preferred that the nano-particle 460 has a size of about 300 to 500 nm and a weight % of about 2 to 5.

The nano-particle 460 may be an organic particle or an inorganic particle. For example, the nano-particle 460 may be a silica inorganic nano-particle, a acryl-based resin organic nano-particle, acryl-styrene-based organic nano-particle or polycarbonate-based organic nano-particle.

As mentioned above, the nano-particle 460 is arranged in the entire of the first region 440 except the pre-determined pattern region 470. Namely, when other region of the first region 440 except the pre-determined pattern region 470 is defined as a non-pattern region, the nano-particle 460 has a first density in the pre-determined pattern region 470 and a second density, which is greater than the first density, in the non-pattern region. The first density may be 0 (zero). In other words, the density of the nano-particle in the pre-determined pattern region 470 is smaller than the density of the nano-particle in the non-pattern region surrounding the pre-determined pattern region 470 or at a periphery of the pre-determined pattern region 470.

In FIG. 8, the pre-determined pattern region 470 has a diamond shape, but it is not limited thereto. For example, the pre-determined pattern region 470 may be the letter or logo.

When the cover window 430 is folded, the pre-determined pattern region 470 is viewed or visible.

Figure 9:
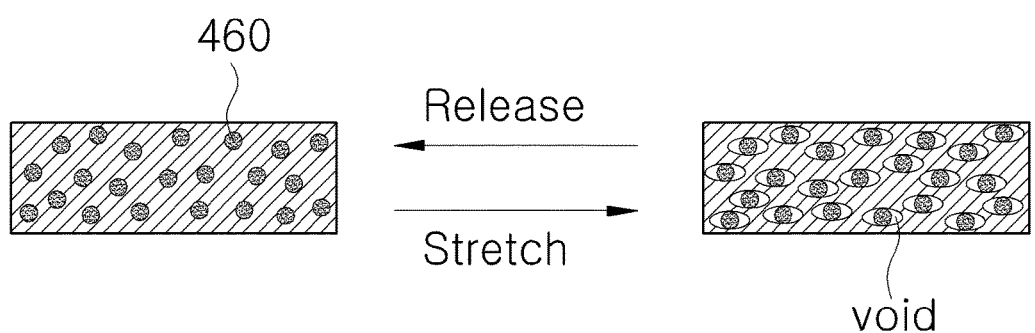
FIG. 9 is a view illustrating the increase of haze by folding operation.

Namely, referring to FIG. 9, which is a view illustrating the increase of haze by folding operation, when the cover window has a flat state, i.e., un-folded or released, weak haze (inner haze) is generated by the nano-particle 460. On the other hand, when the cover window is folded in the folding region FR (of FIG. 8), the first region 440 is stretched such that a void is generated at circumstance (surroundings) of the nano-particle 460. As a result, the haze is increased by the refractive index difference between the void and the nano-particle 460 and/or the void and the first region 440.

Since there is the nano-particle 460 in the non-pattern region of the first region 440, the haze in the non-pattern region except the pre-determined pattern region 470 is increased such that the transmittance in the non-pattern region is decreased. Namely, there are a transmittance difference in the pre-determined pattern region 470 and the non-pattern region such that the pre-determined pattern region 470 is viewed or visible during the folding operation.

Accordingly, during the folding operation, the folding region FR has good appearance. In addition, by displaying a product name or a company name using the pre-determined pattern region 470, the advertising effect may be obtained.

In FIG. 8, there is no nano-particle 460 in the pre-determined pattern region 470. Alternatively, there may be nano-particle 460 in the pre-determined pattern region 470. In this instance, a density of the nano-particle 460 in the pre-determined pattern region 470 is smaller than a density of the nano-particle 460 in the non-pattern region.

Figure 10:
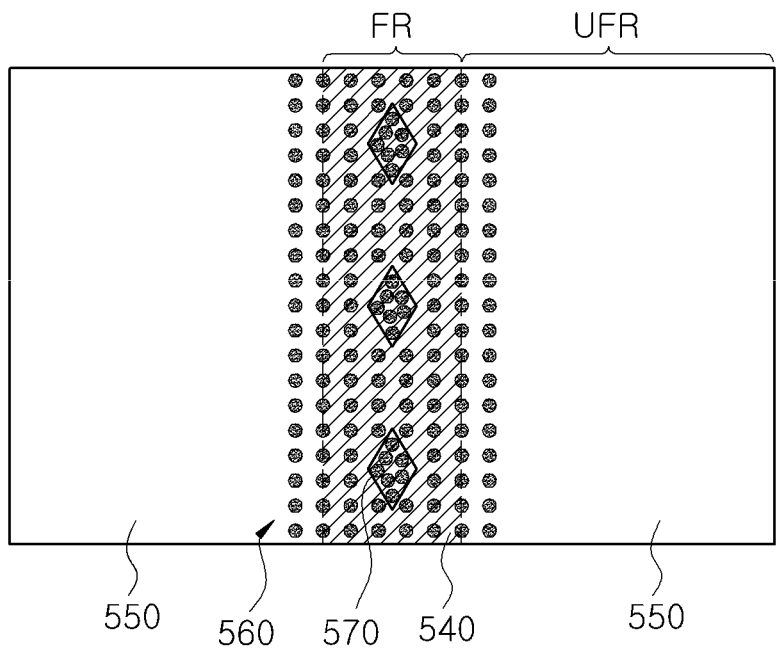
FIG. 10 is a schematic view of a cover window according to an embodiment of the present invention.

FIG. 10 is a schematic view of a cover window according to an embodiment of the present invention.

As shown in FIG. 10, the cover window 530 includes a first region 540 of low stiffness, a second region 550 of low stiffness at both sides of the first region 540 and a nano-particle 560 in an entire of the first region 540 and a boundary between the first and second regions 540 and 550.

The foldable display device 100 (of FIG. 2) is folded with respective to the first region 540. Namely, in the cover window 530, the first region 540 is defined as a folding region FR, and the second region 550 is defined as a un-folding region UFR.

In FIG. 10, one first region 540 is positioned between two second regions 550. Alternatively, there are one first region 540 and one second region 550. In addition, there are at least two first regions 540 and at least three second regions 550, which are alternately arranged, such that the foldable display device 100 may be folded in at least two positions.

The first and second regions 540 and 550 and the nano-particle 560 has a difference in the refractive index. For example, a refractive index difference between each of the first refractive index (R1) of the first region 240 and the second refractive index (R2) of the second region 250 and the third refractive index (R3) of the nano-particle 260 may be equal to or less than about 0.1 (0<|R1−R3|≤0.1, 0<|R2−R3|0.1), and it is preferred to be equal to or less than 0.03. (0<|R1−R3|≤0.03, 0<|R2−R3|0.03)

The nano-particle 560 is arranged in the boundary of the first and second regions 540 and 450 and the entire of the first region and is positioned in a center of the cover window 530 in a cross section. Namely, each of the first and second regions 540 and 550 has a first thickness t1 (of FIG. 6), and the nano-particle 560 is positioned in a central region having a second thickness t2 (of FIG. 6) being smaller than the first thickness t1.

As a result, the nano-particle 560 is covered with the materials of the first and second regions 540 and 550.

In the cover window 530, weak haze is generated because of the refractive index difference between each of the first and second regions 540 and 550 and the nano-particle 560. It may be referred to as an inner haze.

The visibility of the boundary between the first and second regions 540 and 550 resulting from the property difference between the first and second regions 540 and 550 is shielded or covered by the inner haze resulting from the nano-particle 560. Accordingly, the display quality decrease problem in the foldable display device, where the first and second regions 540 and 550 have a stiffness difference and a different property, e.g., refractive index, is prevented.

A first material of the first region 540 has a stiffness (modulus value or hardness) being smaller than a second material of the second region 550.

For example, the first region 540 may be formed of one of polydimethylsiloxane (PDMS), polybutyleacrylate, polyurethane and polystyrene, and the second region 550 may be formed of one of polymethylmetacrylate (PMMA), polycarbonate (PC) and cyclic olefin polymer. Alternatively, the first and second regions 540 and 550 may be formed PDMS and have different modulus values.

The nano-particle 560 may have a size (or diameter) of about 50 to 500 nm and a weight % of about 1 to 10 in the central region where the nano-particle 560 is arranged. To efficiently prevent the visibility of the boundary between the first and second regions 540 and 550 by the inner haze, it may be preferred that the nano-particle 560 has a size of about 300 to 500 nm and a weight % of about 2 to 5.

The nano-particle 560 may be an organic particle or an inorganic particle. For example, the nano-particle 560 may be a silica inorganic nano-particle, a acryl-based resin organic nano-particle, acryl-styrene-based organic nano-particle or polycarbonate-based organic nano-particle.

The first region 540 includes a pre-determined pattern region 570 and a non-pattern region, and the nano-particle 560 is arranged in an entire of the first region 540 including the pre-determined pattern region 570 and the non-pattern region and the boundary between the first and second regions 540 and 550. In the first region 540, the nano-particle 560 has a first density in the pre-determined pattern region 570 and a second density, which is smaller than the first density, in the non-pattern region. In addition, a density of the nano-particle 560 in the pre-determined pattern region 570 may be greater than a density of the nano-particle 560 in the boundary between the first and second regions 540 and 550.

In other words, the nano-particle 560 is arranged in the pre-determined pattern region 570, the non-pattern region and the boundary between the first and second regions 540 and 550. In FIG. 10, the pre-determined pattern region 570 has a diamond shape, but it is not limited thereto. For example, the pre-determined pattern region 570 may be the letter or logo.

When the cover window 530 is folded, the pre-determined pattern region 570 is viewed or visible.

Namely, as explained with FIG. 9, which is a view illustrating the increase of haze by folding operation, when the cover window has a flat state, i.e., un-folded or released, weak haze (inner haze) is generated by the nano-particle 560. On the other hand, when the cover window is folded in the folding region FR (of FIG. 10), the first region 540 is stretched such that a void is generated at circumstance (surroundings) of the nano-particle 560. As a result, the haze is increased by the refractive index difference between the void and the nano-particle 560 and/or the void and the first region 540.

Since there is the nano-particle 560 in the entire of the first region 540, the haze in the first region 540 is increased such that the transmittance in the first region 540 is decreased. In this instance, since a density of the nano-particle 560 in the pre-determined pattern region 570 is greater than a density of the nano-particle 560 in the non-pattern region, there are a transmittance difference in the pre-determined pattern region 570 and the non-pattern region such that the pre-determined pattern region 570 is viewed or visible during the folding operation.

Accordingly, during the folding operation, the folding region FR has good appearance. In addition, by displaying a product name or a company name using the pre-determined pattern region 570, the advertising effect may be obtained.

In the cover window 530 in FIG. 10, the nano-particle 560 are arranged in the entire of the first region 540 including the pre-determined pattern 570.

Figure 11:
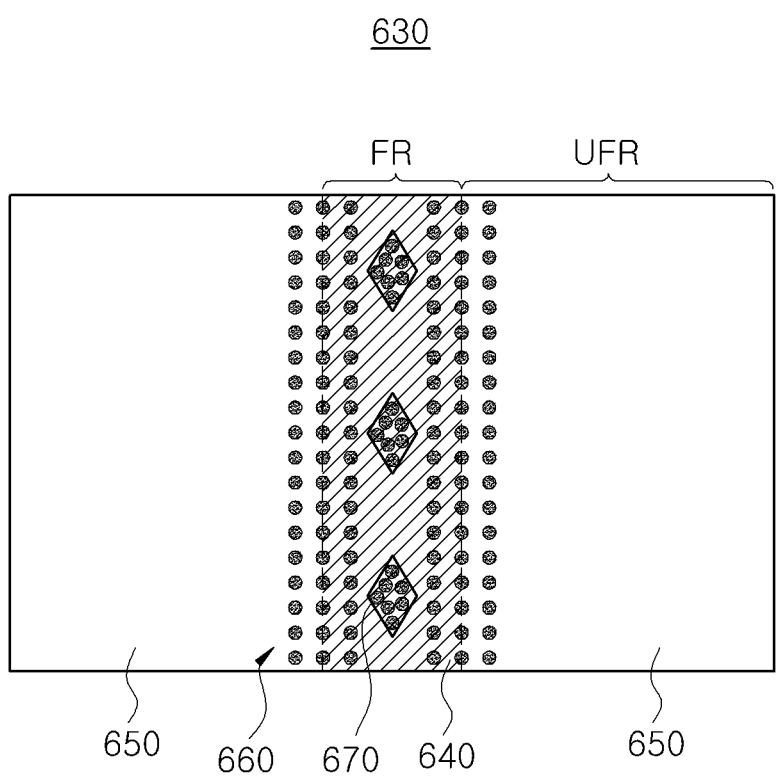
FIG. 11 is a schematic view of a cover window according to an embodiment of the present invention.

Alternatively, as shown in FIG. 11, which is a schematic view of a cover window according to an embodiment of the present invention, there may be no nano-particle 660 in the non-pattern region. Namely, the nano-particle 660 is positioned in the pre-determined pattern region 670 and the boundary between the folding region FR and the non-folding region UFR. In addition, a density of the nano-particle 660 in the pre-determined pattern region 670 may be greater than a density of the nano-particle 660 in the boundary between the first and second regions 640 and 650.

As mentioned above, in the cover windows 430, 530 and 630 of the present invention, the nano-particle in the first region as the folding region has a density difference such that the pre-determined pattern region is viewed by a transmittance difference in the folding operation.

It will be apparent to those skilled in the art that various modifications and variations can be made in the cover window and the foldable display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A cover window, comprising:
a first region having a first stiffness;
a second region having a second stiffness greater than the first stiffness, the second region including a first portion and a second portion, wherein the first portion is closer to the first region than the second portion; and
a nano-particle in the first portion and not in the second portion,
wherein the first region has a first thickness, and the nano-particle is positioned within the first region at a second thickness smaller than the first thickness.

2. The cover window according to claim 1, wherein the first region includes a pattern region and a non-pattern region at a periphery of the pattern region, and the nano-particle is positioned in one of the pattern region and the non-pattern region except the other one of the pattern region and the non-pattern region.

3. The cover window according to claim 1, wherein the nano-particle has a size of about 50 to 500 nm.

4. The cover window according to claim 1, wherein the nano-particle has a weight % of about 1 to 10 in a region including the nano-particle.

5. The cover window according to claim 1, wherein the first region includes a pattern region and a non-pattern region at a periphery of the pattern region, and wherein the nano-particle has a first density in the pattern region and a second density in the non-pattern region, and the first density is different from the second density.

6. The cover window according to claim 5, wherein one of the first and second density is 0.

7. The cover window according to claim 5, wherein the first density is greater than the second density, and
wherein when the cover window is folded, the pattern region has a first transmittance, and the non-pattern region has a second transmittance being greater than the first transmittance.

8. The cover window according to claim 5, wherein the first density is smaller than the second density, and
wherein when the cover window is folded, the pattern region has a first transmittance, and the non-pattern region has a second transmittance being smaller than the first transmittance.

9. The cover window according to claim 5, wherein the first density is greater than the second density, and
wherein when the cover window is folded, the pattern region has a first haze, and the non-pattern region has a second haze being greater than the first transmittance.

10. The cover window according to claim 5, wherein the first density is smaller than the second density, and
wherein when the cover window is folded, the pattern region has a first haze, and the non-pattern region has a second haze being smaller than the first transmittance.

11. A cover window, comprising:
a first region having a first stiffness and including a pattern region and a non-pattern region at a periphery of the pattern region;
a second region having a second stiffness greater than the first stiffness; and
a nano-particle in the first region,
wherein the nano-particle has a first density in the pattern region and a second density in the non-pattern region, and the first density is different from the second density,
wherein the cover window has a single-layered structure,
wherein the first region has a first thickness, and the nano-particle is positioned within the first region at a second thickness smaller than the first thickness.

12. The cover window according to claim 11, wherein one of the first and second density is 0.

13. The cover window according to claim 11, wherein the first density is greater than the second density, and
wherein when the cover window is folded, the pattern region has a first transmittance, and the non-pattern region has a second transmittance being greater than the first transmittance.

14. The cover window according to claim 11, wherein the first density is smaller than the second density, and
wherein when the cover window is folded, the pattern region has a first transmittance, and the non-pattern region has a second transmittance being smaller than the first transmittance.

15. The cover window according to claim 11, wherein the first density is greater than the second density, and wherein when the cover window is folded, the pattern region has a first haze, and the non-pattern region has a second haze being greater than the first transmittance.

16. The cover window according to claim 11, wherein the first density is smaller than the second density, and
wherein when the cover window is folded, the pattern region has a first haze, and the non-pattern region has a second haze being smaller than the first transmittance.

17. The cover window according to claim 11, wherein the nano-particle has a size of about 50 to 500 nm.

18. A foldable display device, comprising:
a display panel; and
a cover window on a display side of the display panel, the cover window including:
  a first region having a first stiffness;
  a second region having a second stiffness greater than the first stiffness, the second region including a first portion and a second portion, wherein the first portion is closer to the first region than the second portion; and
  a nano-particle in the first portion and not in the second portion,
wherein the cover window has a single-layered structure,
wherein the first region has a first thickness, and the nano-particle is positioned within the first region at a second thickness smaller than the first thickness.

19. A foldable display device, comprising:
a display panel; and
a cover window on a display side of the display panel, the cover window including:
  a first region having a first stiffness and including a pattern region and a non-pattern region at a periphery of the pattern region;
  a second region having a second stiffness greater than the first stiffness; and
  a nano-particle in the first region,
wherein the nano-particle has a first density in the pattern region and a second density in the non-pattern region, and the first density is different from the second density,
wherein the cover window has a single-layered structure,
wherein the first region has a first thickness, and the nano-particle is positioned within the first region at a second thickness smaller than the first thickness.

* * * * *